US010886314B2

(12) United States Patent
Shiota et al.

(10) Patent No.: US 10,886,314 B2
(45) Date of Patent: Jan. 5, 2021

(54) RADIATION DETECTOR

(71) Applicant: SHARP KABUSHIKI KAISHA, Sakai (JP)

(72) Inventors: Masahiro Shiota, Sakai (JP); Shigenari Taguchi, Sakai (JP); Takahiro Shindoh, Sakai (JP); Kunihiko Iizuka, Sakai (JP); Nobuyuki Ashida, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/441,842

(22) Filed: Jun. 14, 2019

(65) Prior Publication Data
US 2019/0386046 A1    Dec. 19, 2019

Related U.S. Application Data

(60) Provisional application No. 62/686,787, filed on Jun. 19, 2018.

(51) Int. Cl.
H01L 27/146    (2006.01)
G01T 1/24      (2006.01)
H01L 29/24     (2006.01)
H01L 29/786    (2006.01)

(52) U.S. Cl.
CPC ........ H01L 27/14616 (2013.01); G01T 1/24 (2013.01); H01L 27/14663 (2013.01); H01L 29/24 (2013.01); H01L 29/7869 (2013.01)

(58) Field of Classification Search
CPC ........ H01L 27/14616; H01L 27/14663; H01L 29/7869; G01T 1/24
See application file for complete search history.

(56) References Cited

U.S. PATENT DOCUMENTS

| 2003/0189159 | A1* | 10/2003 | Inoue ........... H01L 27/14609 250/208.1 |
| 2009/0084961 | A1* | 4/2009 | Tonotani ........... G01T 1/2018 250/361 R |
| 2010/0320391 | A1 | 12/2010 | Antonuk |
| 2015/0097180 | A1* | 4/2015 | Yu ........... H01L 27/14687 257/43 |
| 2015/0340511 | A1* | 11/2015 | Yan ........... H01L 29/66969 257/43 |
| 2016/0013242 | A1* | 1/2016 | Yang ........... H01L 27/1446 257/292 |
| 2016/0266695 | A1* | 9/2016 | Bae ........... G06K 9/00053 |
| 2016/0293658 | A1* | 10/2016 | Gao ........... G01T 1/244 |
| 2016/0336373 | A1* | 11/2016 | Gao ........... H01L 27/14612 |
| 2018/0203137 | A1 | 7/2018 | *Iizuka et al. |
| 2018/0356542 | A1* | 12/2018 | Kim ........... G01T 1/2018 |

FOREIGN PATENT DOCUMENTS

JP    2012-531046 A    12/2012
WO   2017/010202 A1    1/2017

* cited by examiner

Primary Examiner — Dung A. Le
(74) Attorney, Agent, or Firm — ScienBiziP, P.C.

(57) ABSTRACT

[Object] To achieve a high-sensitivity radiation detector.
[Solution] An amplifying transistor (3) is configured such that a photodiode (1) receives light with the amplifying transistor (3) conductive.

8 Claims, 14 Drawing Sheets

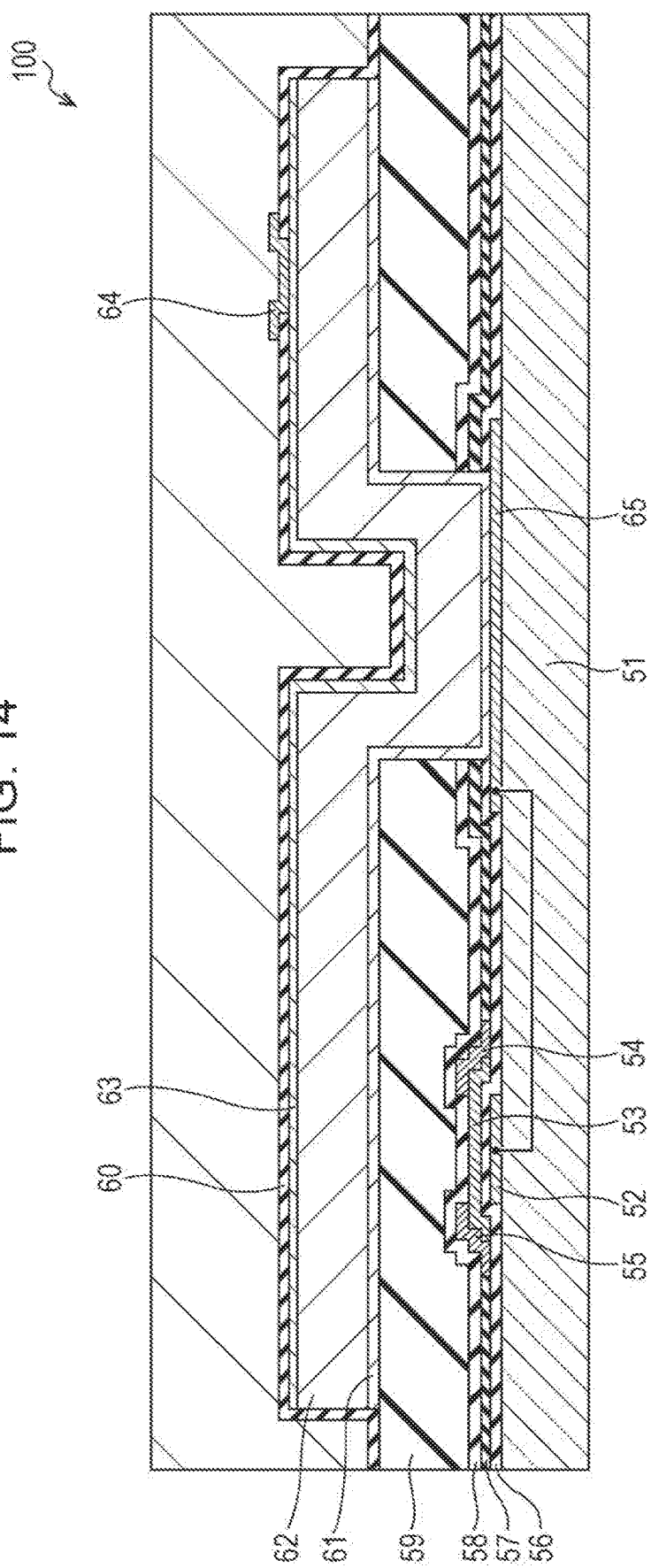

RADIATION DETECTOR

TECHNICAL FIELD

The present invention relates to a radiation detector.

BACKGROUND ART

During these years, radiation detectors employing a solid device such as an imaging device are being developed as radiation detectors for detecting radiation such as X-rays, instead of conventional radiation detectors employing intensifying screen and X-ray film. Radiation detectors (radiation imagers) employing a TFT (thin-film transistor) panel, in particular, are being eagerly developed because, compared to radiation detectors employing an imaging device such as a CCD (charge-coupled device) or a CMOS (complementary metal-oxide-semiconductor) device, the radiation detectors are advantageous in that the radiation detectors do not require lenses and are suitable for large-screen imaging.

PTL 1 discloses a radiation detector whose S/N ratio is improved by using a radiation detector based on an APS (active pixel sensor) method.

CITATION LIST

Patent Literature

[PTL 1] International Publication No. 2017-010202 (published on Jan. 19, 2017)

SUMMARY OF INVENTION

Technical Problem

In an APS method, because the amount of radiation is detected by amplifying generated charge using a TFT, a smaller charge can be detected than when a radiation detector based on a PPS (passive pixel sensor) method is used.

Although PTL 1 discloses how to read a detection current amplified by a TFT, which part of current characteristics of the TFT is to be used in the amplification by the TFT is not sufficiently examined. In the technique disclosed in PTL 1, therefore, a problem is caused that it is difficult to achieve a radiation detector that is sufficiently sensitive.

An aspect of the present invention aims to achieve a high-sensitivity radiation detector.

Solution to Problem (1) An embodiment of the present invention is a radiation detector including a light receiving device that receives light obtained from radiation and that converts the light into an electrical signal and an amplifying transistor that amplifies the electrical signal. The amplifying transistor is configured such that the light receiving device receives the light with the amplifying transistor conductive.

(2) Another embodiment of the present invention is the radiation detector according to (1) in which the light receiving device is a photodiode.

(3) Another embodiment of the present invention is the radiation detector according to (1) or (2) in which the amplifying transistor includes a channel layer. The channel layer includes an oxide semiconductor having a non-amorphous crystal structure.

(4) Another embodiment of the present invention is the radiation detector according to any of (1) to (3) in which the amplifying transistor includes a channel layer. Constituent elements of the channel layer include at least indium and zinc.

(5) Another embodiment of the present invention is the radiation detector according to any of (1) to (4) in which the light receiving device is provided above the amplifying transistor.

Advantageous Effects of Invention

According to an aspect of the present invention, a high-sensitivity radiation detector can be achieved.

BRIEF DESCRIPTION OF DRAWINGS

FIG. 14 is a diagram illustrating a cross-sectional structure of the radiation detector according to the first embodiment of the present invention.

DESCRIPTION OF EMBODIMENTS

First Embodiment

Figure 7:
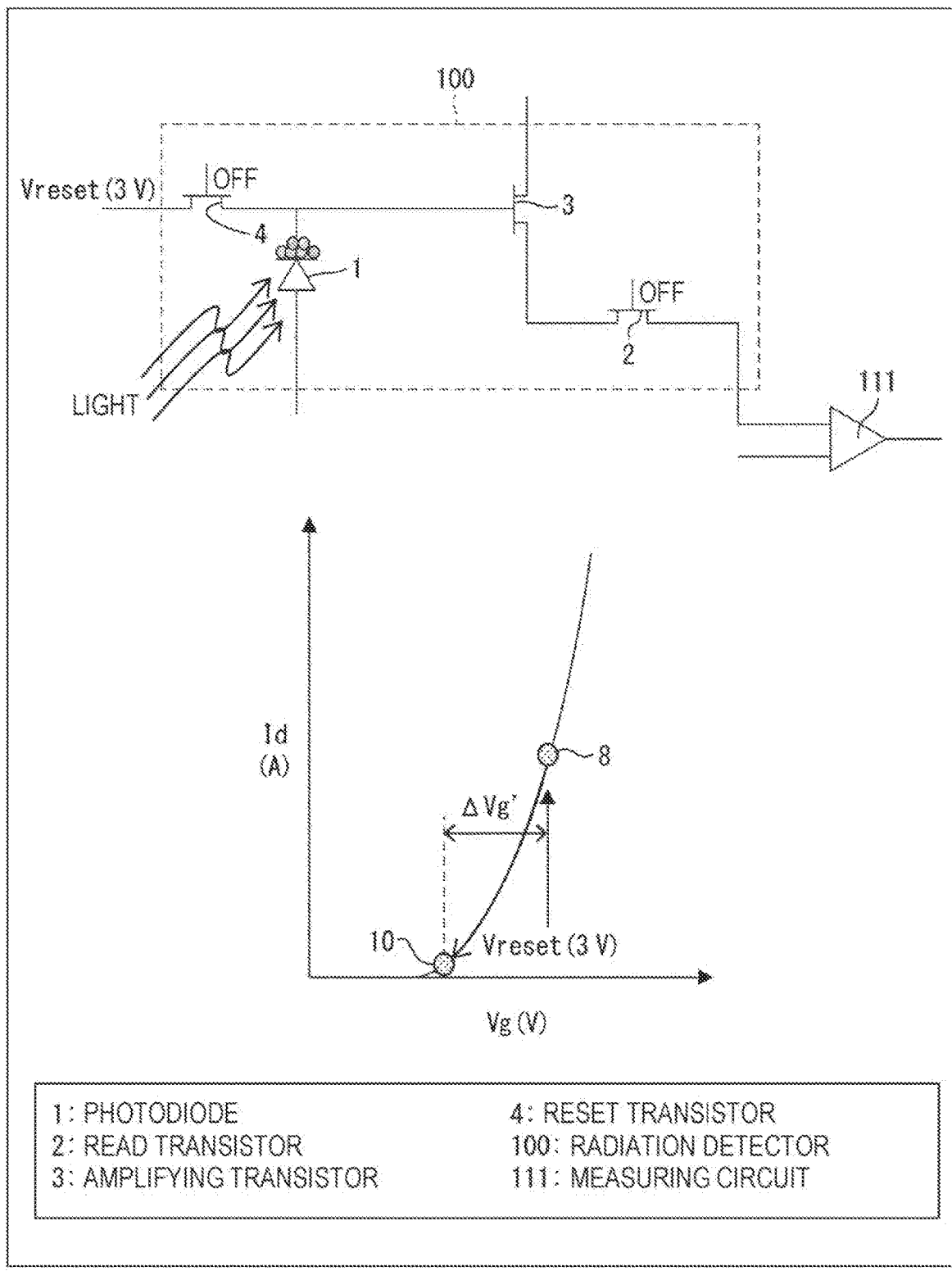
FIG. 7 is a circuit diagram illustrating the configuration of the radiation detector according to the first embodiment of the present invention and illustrates a modification of the fourth step of the operation mechanism.

FIGS. 1 to 6 are circuit diagrams illustrating the configuration of a radiation detector 100 according to a first embodiment of the present invention and illustrate first to sixth steps, respectively, of as operation mechanism. FIG. 7 is a circuit diagram illustrating the configuration of the radiation detector 100 according to the first embodiment of the present invention and illustrates a modification of the fourth step of the operation mechanism. In FIGS. 1 to 7, graphs of curves indicating characteristics of a current Id (vertical axis; unit A) flowing to an amplifying transistor 3 relative to a gate voltage Vg (horizontal axis; unit V) of the amplifying transistor 3 are also presented. The modification of the fourth step will be referred to as a "4'th step" hereinafter.

The radiation detector 100 is an APS including a photodiode 1, a read transistor 2, the amplifying transistor 3, and a reset transistor 4. FIGS. 1 to 7 illustrate a measuring circuit 111 in addition to the radiation detector 100.

Figure 1:
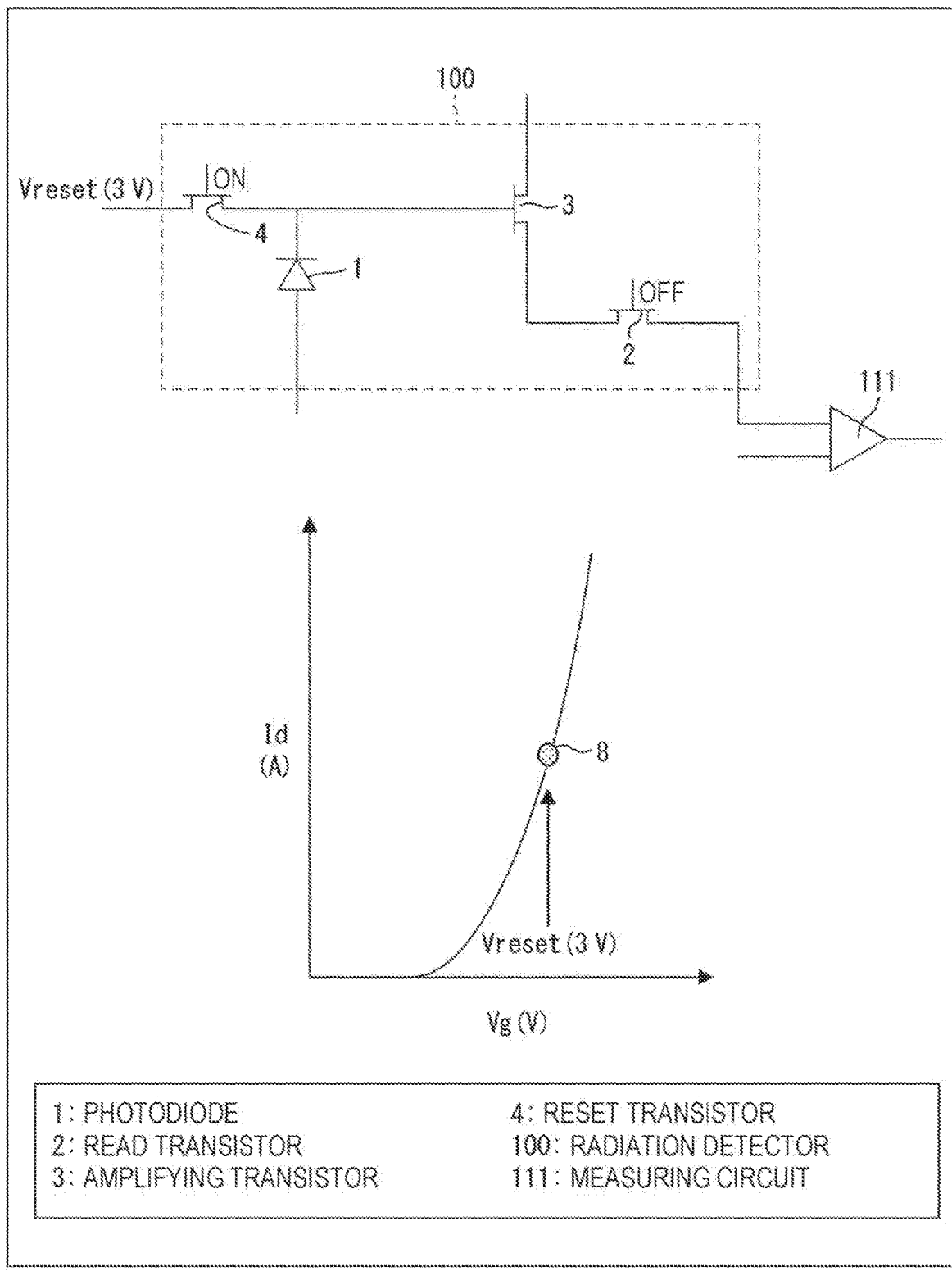
FIG. 1 is a circuit diagram illustrating the configuration of a radiation detector according to a first embodiment of the present invention and illustrates a first step of an operation mechanism.
Figure 2:
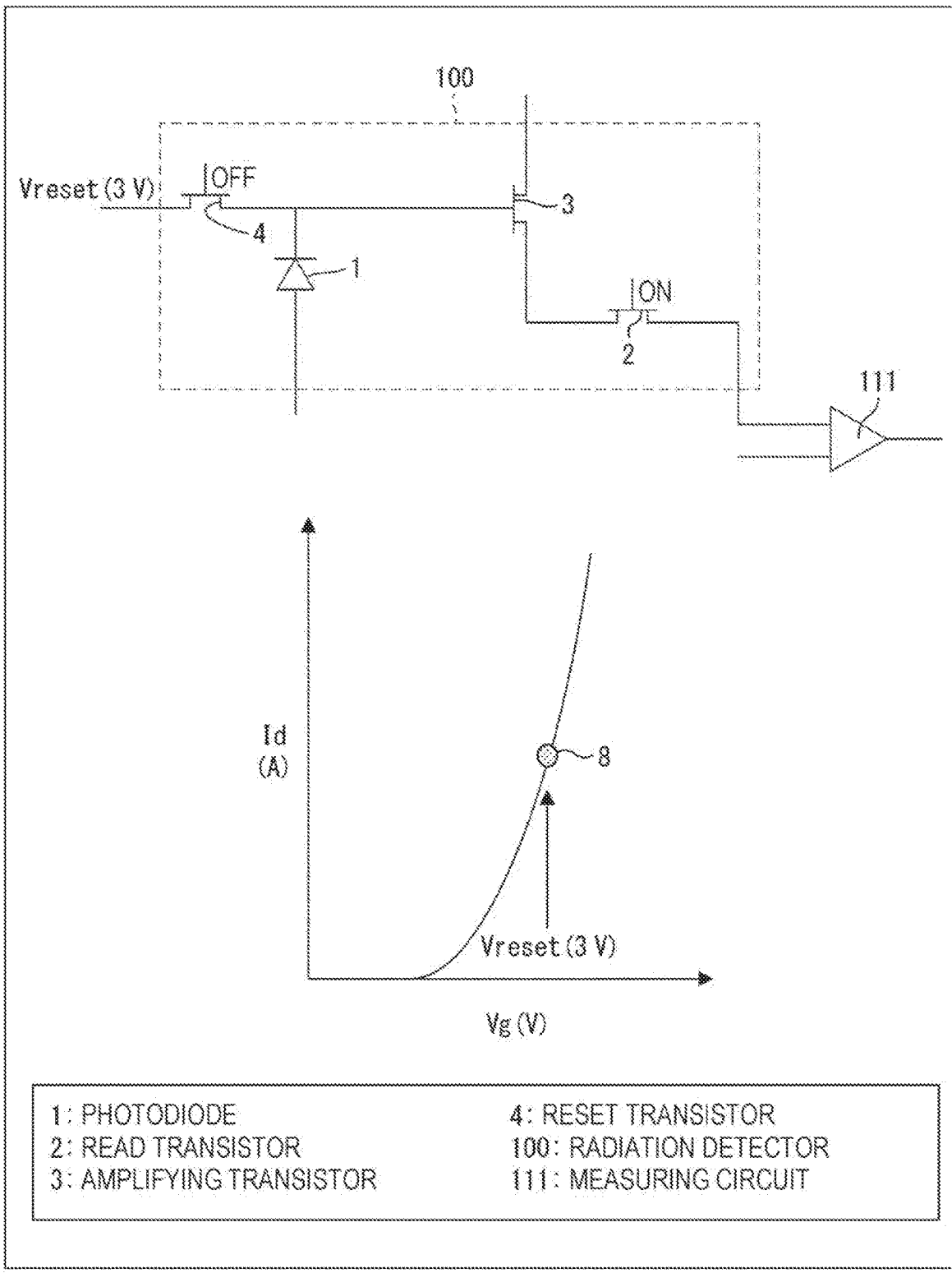
FIG. 2 is a circuit diagram illustrating the configuration of the radiation detector according to the first embodiment of the present invention and illustrates a second step of the operation mechanism.
Figure 3:
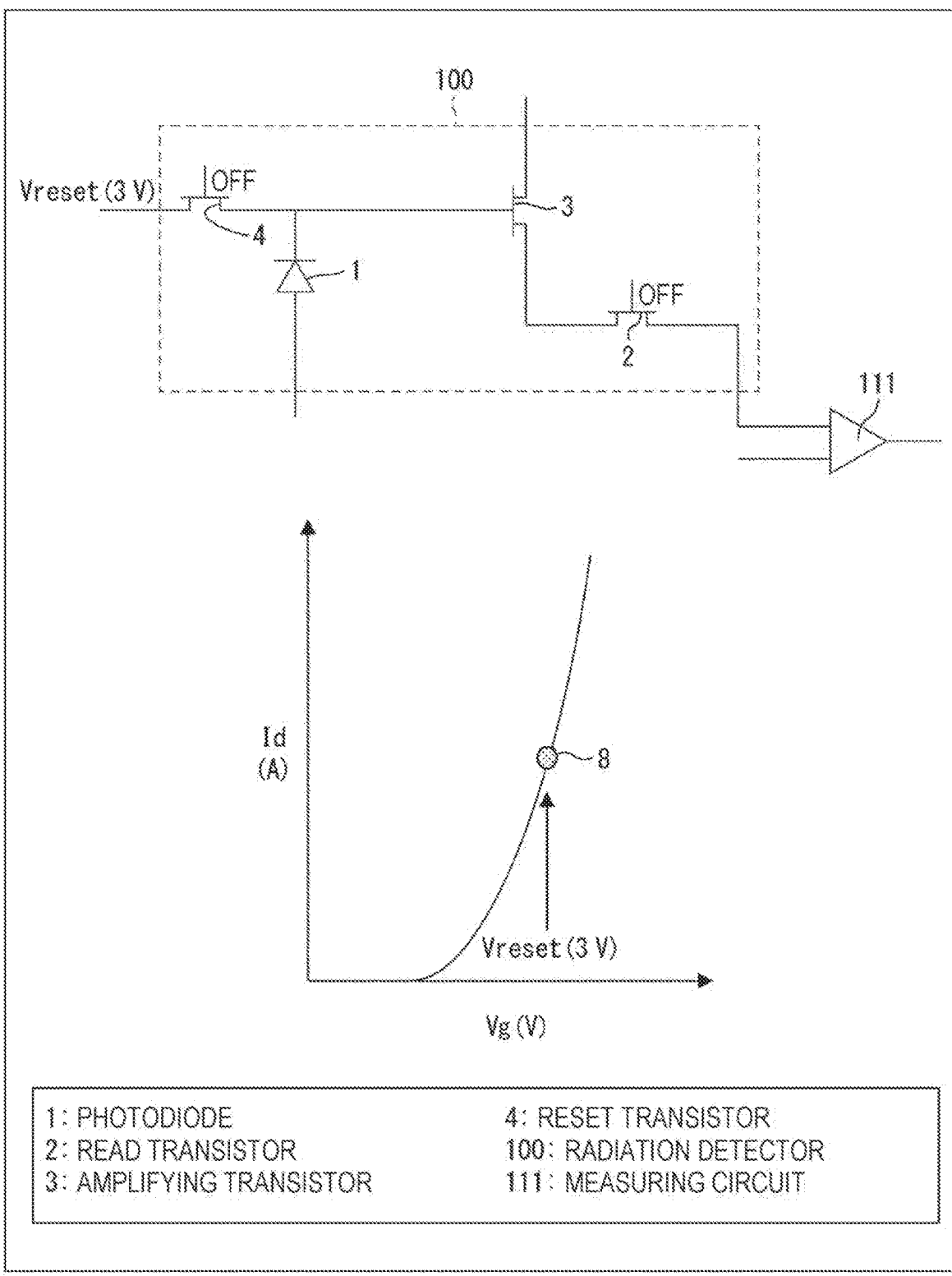
FIG. 3 is a circuit diagram illustrating the configuration of the radiation detector according to the first embodiment of the present invention and illustrates a third step of the operation mechanism.
Figure 4:
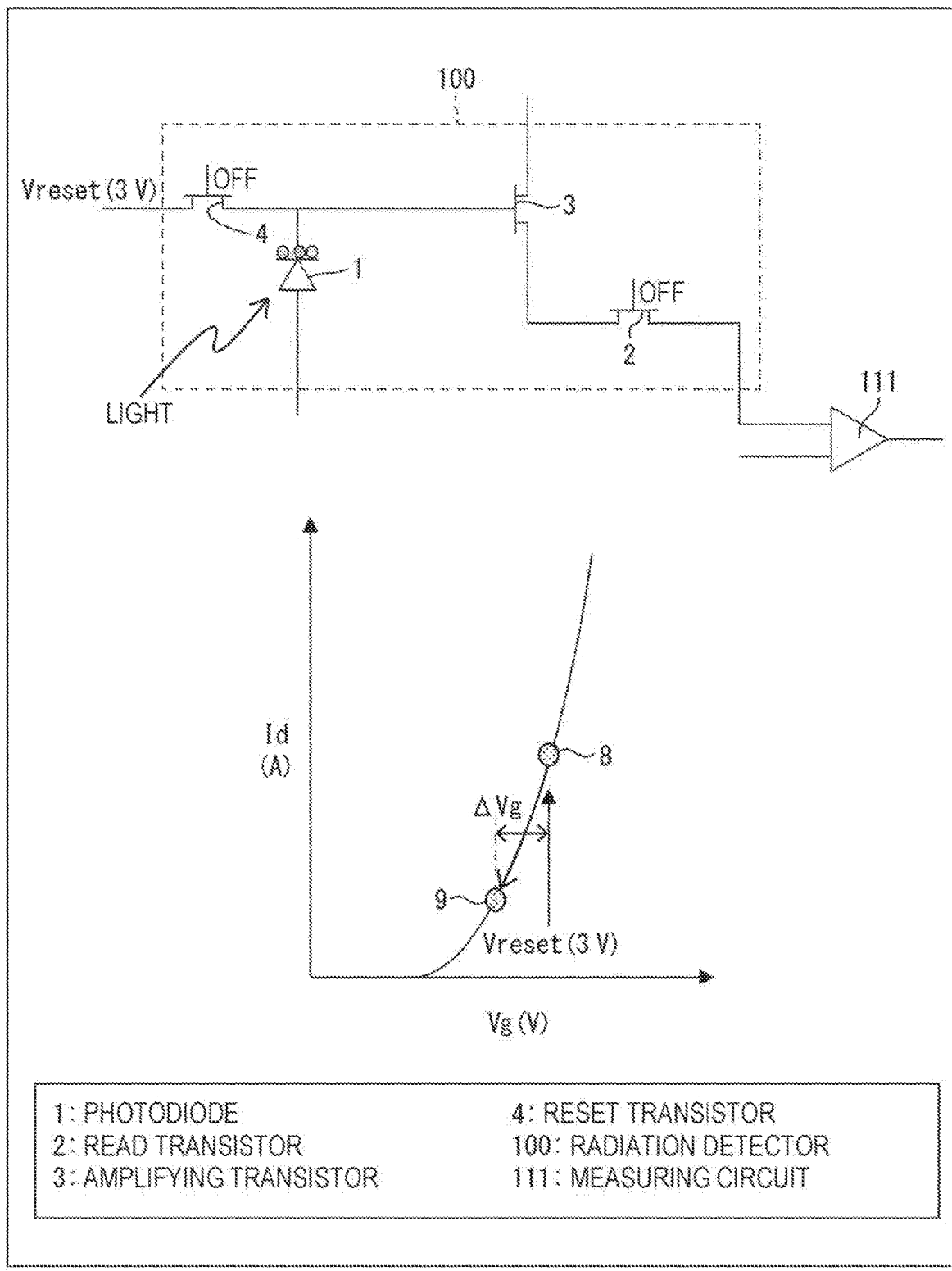
FIG. 4 is a circuit diagram illustrating the configuration of the radiation detector according to the first embodiment of the present invention and illustrates a fourth step of the operation mechanism.
Figure 5:
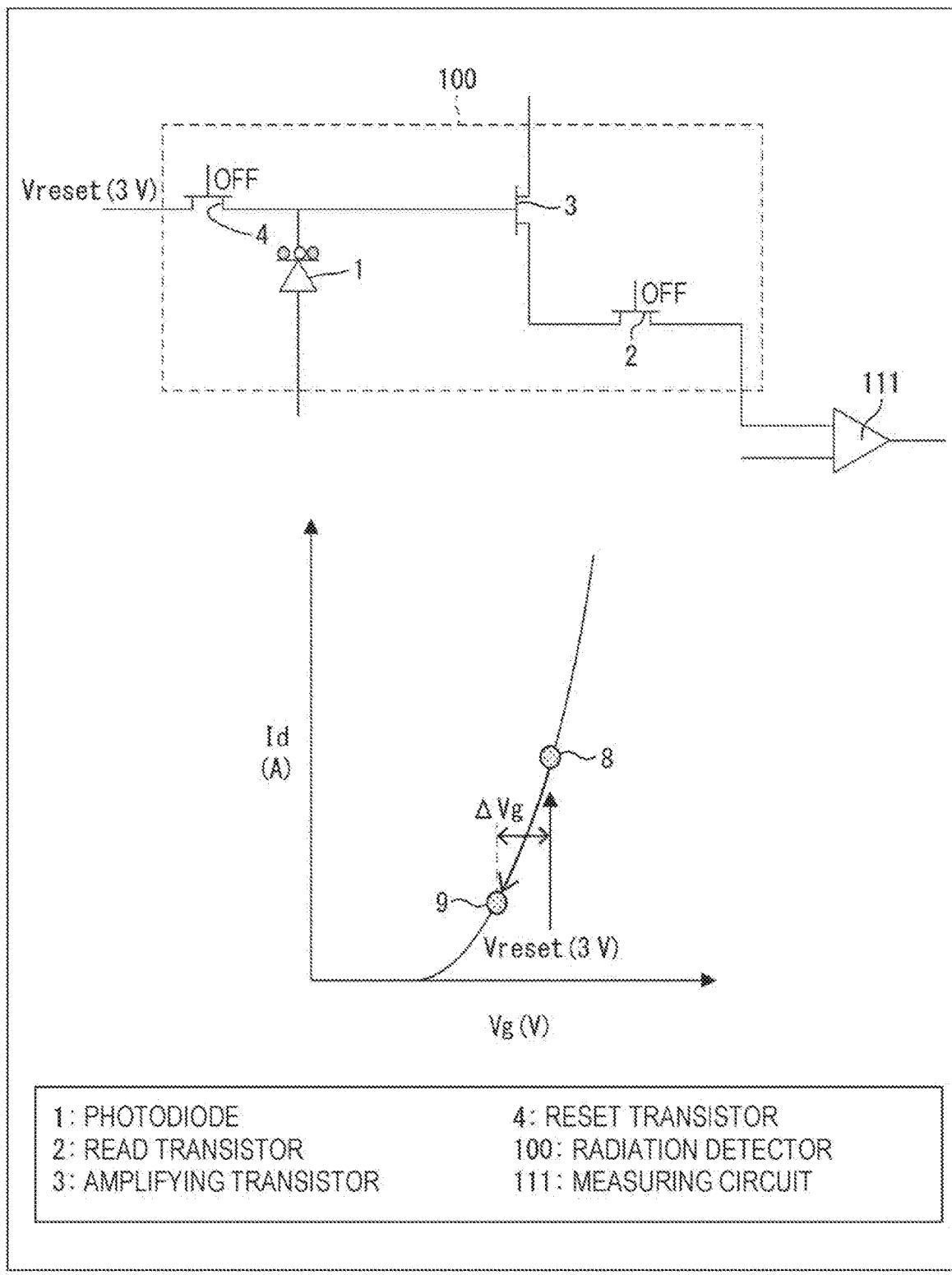
FIG. 5 is a circuit diagram illustrating the configuration of the radiation detector according to the first embodiment of the present invention and illustrates a fifth step of the operation mechanism.
Figure 6:
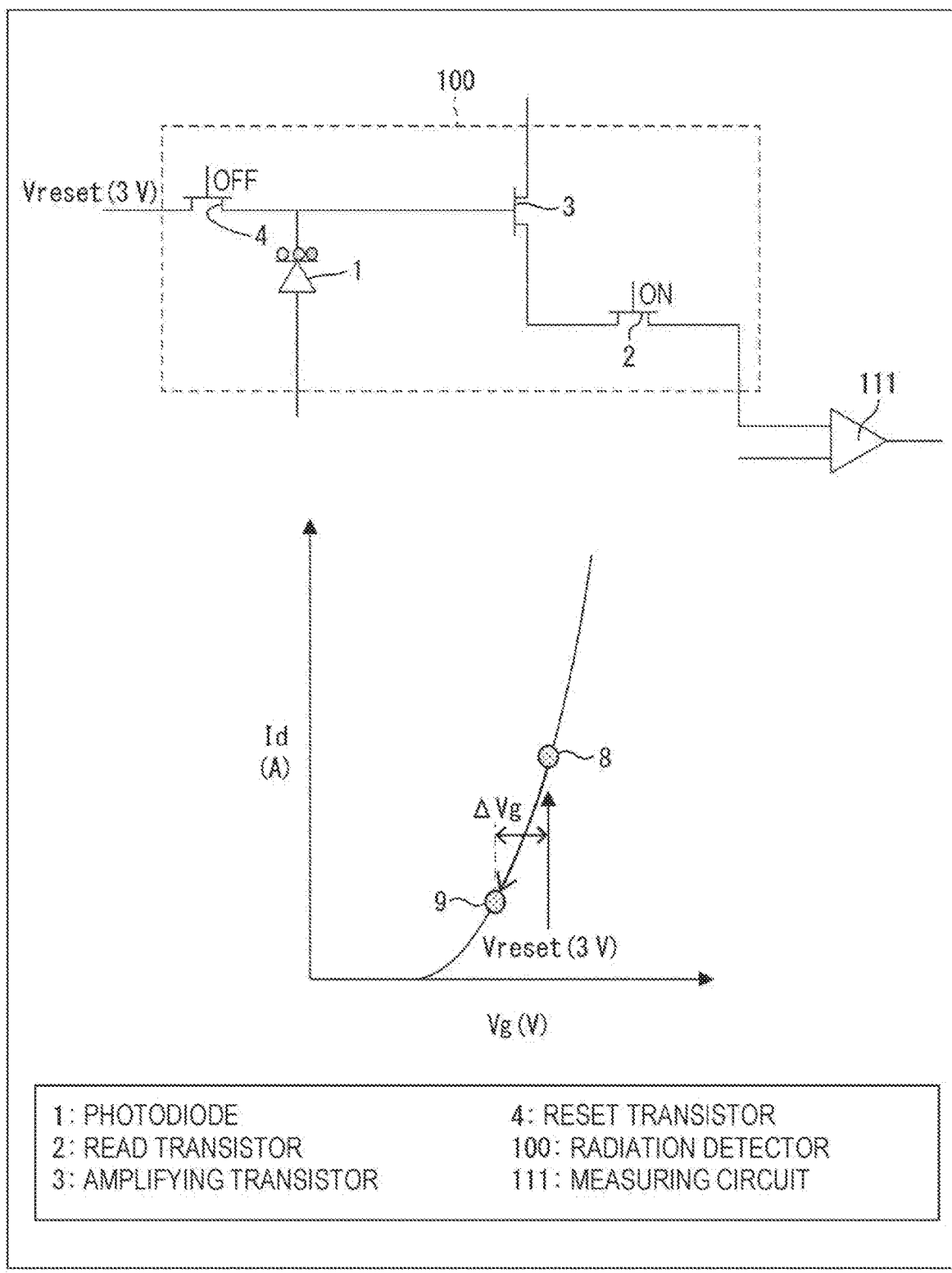
FIG. 6 is a circuit diagram illustrating the configuration of the radiation detector according to the first embodiment of the present invention and illustrates a sixth step of the operation mechanism.
Figure 8:
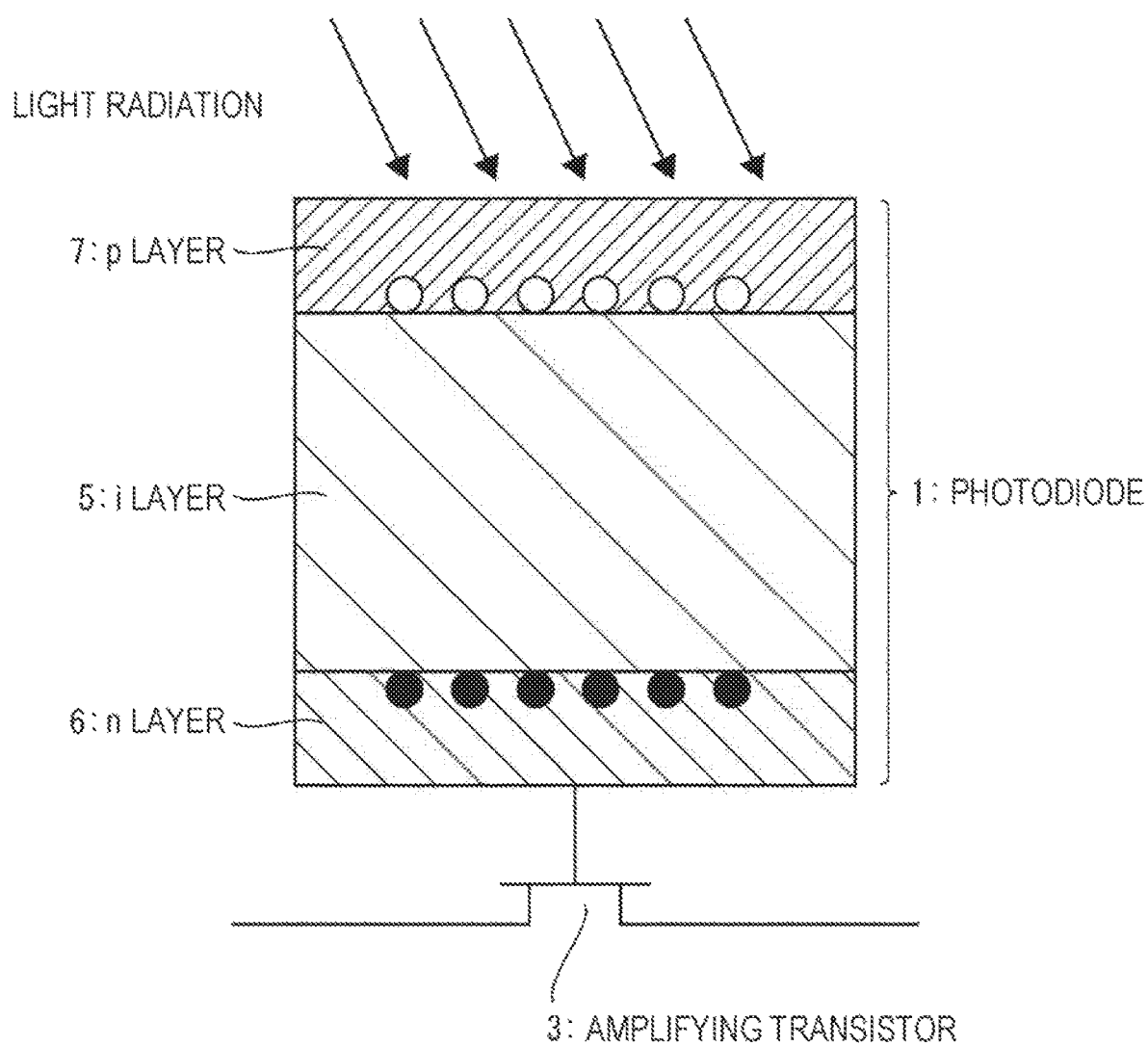
FIG. 8 is an image diagram illustrating a connection relationship between a photodiode and a gate of an amplifying transistor in the radiation detector illustrated in FIG. 1.

FIG. 8 is an image diagram illustrating a connection relationship between the photodiode 1 and a gate of the amplifying transistor 3 in the radiation detector 100 illustrated in FIG. 1.

The photodiode 1 generates charge from received light. The read transistor 2 is a switch that connects the amplifying transistor 3 and the measuring circuit 111 with each other. The amplifying transistor 3 outputs the current Id proportional to the charge generated by the photodiode 1. The reset transistor 4 is used to reset the charge generated by the photodiode 1.

The above description can be paraphrased as follows. The photodiode 1 is, for example, a light receiving device that receives light (light obtained from radiation) from a scintillator, which is not illustrated, and that converts the light into an electrical signal. The amplifying transistor 3 amplifies the electrical signal. The read transistor 2 is a switch connected between the amplifying transistor 3 and the measuring circuit 111 and controls a timing at which the electrical signal amplified by the amplifying transistor 3 is supplied to the measuring circuit 111.

The measuring circuit 111 then obtains the amount of the light received by the photodiode 1 on the basis of a level of the electrical signal amplified by the amplifying transistor 3. As a result, the amount of radiation can be detected for each of pixels, which are not illustrated, corresponding to the radiation detector 100. The measuring circuit 111 is, for example, a comparator having an input terminal to which the electrical signal amplified by the amplifying transistor 3 is supplied and another input terminal to which a reference voltage is supplied. The configuration of the measuring circuit 111, however, is not limited to this.

A cathode of the photodiode 1 is connected to a node between the amplifying transistor 3 and the reset transistor 4. As illustrated in FIG. 8, the photodiode 1 has a configuration in which an n layer 6, which is an n-type semiconductor layer, and a p layer 7, which is a p-type semiconductor layer, are connected to each other through an i layer 5, which does not include an impurity. A bias voltage whose potential is lower in the p layer 7 than in the n layer 6 is applied, and if light is incident on the p layer 7 when the photodiode 1 receives light, holes (positive holes) gather in the p layer 7, and electrons gather in the n layer 6. In the radiation detector 100, the n layer 6 is connected to the gate of the amplifying transistor 3. As a result, in the radiation detector 100, the voltage Vg decreases due to the electrons generated as a result of the reception of light by the photodiode 1, and the current Id according to the decrease in the voltage Vg flows.

In the radiation detector 100, the amplifying transistor 3 is configured such that the photodiode 1 receives the light with the amplifying transistor 3 conductive. The operation mechanism of the radiation detector 100 relating to the configuration will be described hereinafter with reference to FIGS. 1 to 6.

First, in the first step, the reset transistor 4 becomes conductive, and the voltage Vg becomes a voltage Vreset given from the outside via the reset transistor 4 that is conductive (see a point 8). In the present embodiment, the voltage Vreset is 3 V. Because the read transistor 2 is nonconductive at this time, the current Id does not flow.

Next, in the second step, the reset transistor 4 becomes nonconductive, and resetting of the radiation detector 100 ends. In the second step, the voltage Vg remains at the voltage Vreset because the resetting has just ended. In addition, in the second step, the read transistor 2 becomes conductive, and the current Id flows. Charge from the amplifying transistor 3 (proportional to the current Id×the duration of a conductive state of the read transistor 2) is then supplied to the measuring circuit 111.

Next, in the third step, the read transistor 2 becomes nonconductive, and the supply of the charge from the amplifying transistor 3 to the measuring circuit 111 ends. The current Id does not flow in the third step.

Next in the fourth step, the photodiode 1 receives light, and electrons are accumulated in the photodiode 1 on a side of the amplifying transistor 3, that is, on a side of the cathode of the photodiode 1, and the voltage Vg decreases (see a point 9). Here, the amount of decrease in the voltage Vg from the voltage Vreset in the fourth step is a voltage ΔVg. Since the read transistor 2 is nonconductive, the current Id does not flow.

Next, in the fifth step, the reception of light by the photodiode 1 ends. At this time, the voltage Vg is (voltage Vreset−voltage ΔVg). In other words, the voltage Vg in the fifth step is the same as the voltage Vg in the fourth step.

Next, in the sixth step, the read transistor 2 becomes conductive, and the current Id flows. As in the second step, the charge from the amplifying transistor 3 is supplied to the measuring circuit 111. At this time, since the voltage Vg has decreased in the fourth step, the current Id has also decreased. The radiation detector 100 repeatedly performs the first to sixth steps each time the amount of radiation is detected.

A difference between the amount of charge from the amplifying transistor 3 in the second step and the amount of charge from the amplifying transistor 3 in the sixth step correlates with the amount of light received by the photodiode 1. A differential charge amplified more than the charge generated in the photodiode 1 can be obtained by applying the charge generated in the photodiode 1 to the gate of the amplifying transistor 3. That is, the amplifying transistor 3 can be used as an amplifier of electrical signals.

In the 4'th step, the photodiode 1 receives light. The amount of light received by the photodiode 1 in the 4'th step is significantly larger than the amount of light received by the photodiode 1 in the fourth step. As the photodiode 1 receives light, charge is accumulated in the photodiode 1 on the side of the cathode, and the voltage Vg decreases (see a point 10). Here, the amount of decrease in the voltage Vg relative to the voltage Vreset in the 4'th step is a voltage ΔVg'. The voltage ΔVg' is higher than the voltage ΔVg. Since the read transistor 2 is nonconductive, the current Id does not flow.

The voltage Vg is the voltage Vreset from a start of the first step, and the gate of the amplifying transistor 3 to which the voltage Vreset is applied is conductive. It can therefore be seen that the amplifying transistor 3 is configured such that the photodiode 1 receives the light with the amplifying transistor 3 conductive.

With the radiation detector 100, the current Id can be greatly changed even if a change in the voltage Vg caused by the reception of light by the photodiode 1 is small. This is because, as the voltage Vg becomes higher, the amount of change in the current Id corresponding to the amount of change in the voltage Vg becomes larger and it becomes easier to set a higher voltage Vreset for determining the voltage Vg before the photodiode 1 receives light. With the above configuration, therefore, a high-sensitivity radiation detector 100 can be achieved.

Figure 9:
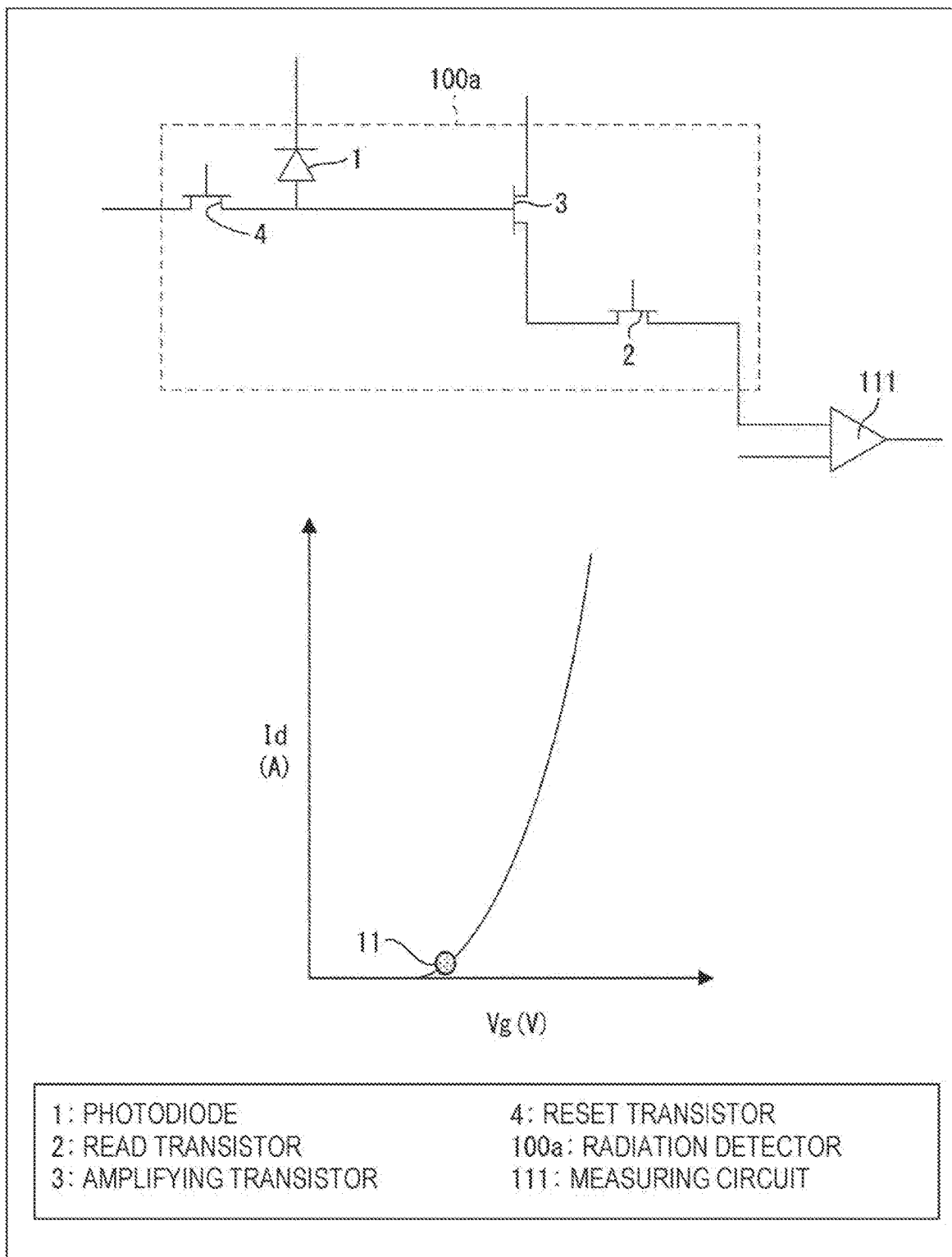
FIG. 9 is a circuit diagram illustrating the configuration of a radiation detector according to a comparative example and illustrates a first step of an operation mechanism.
Figure 10:
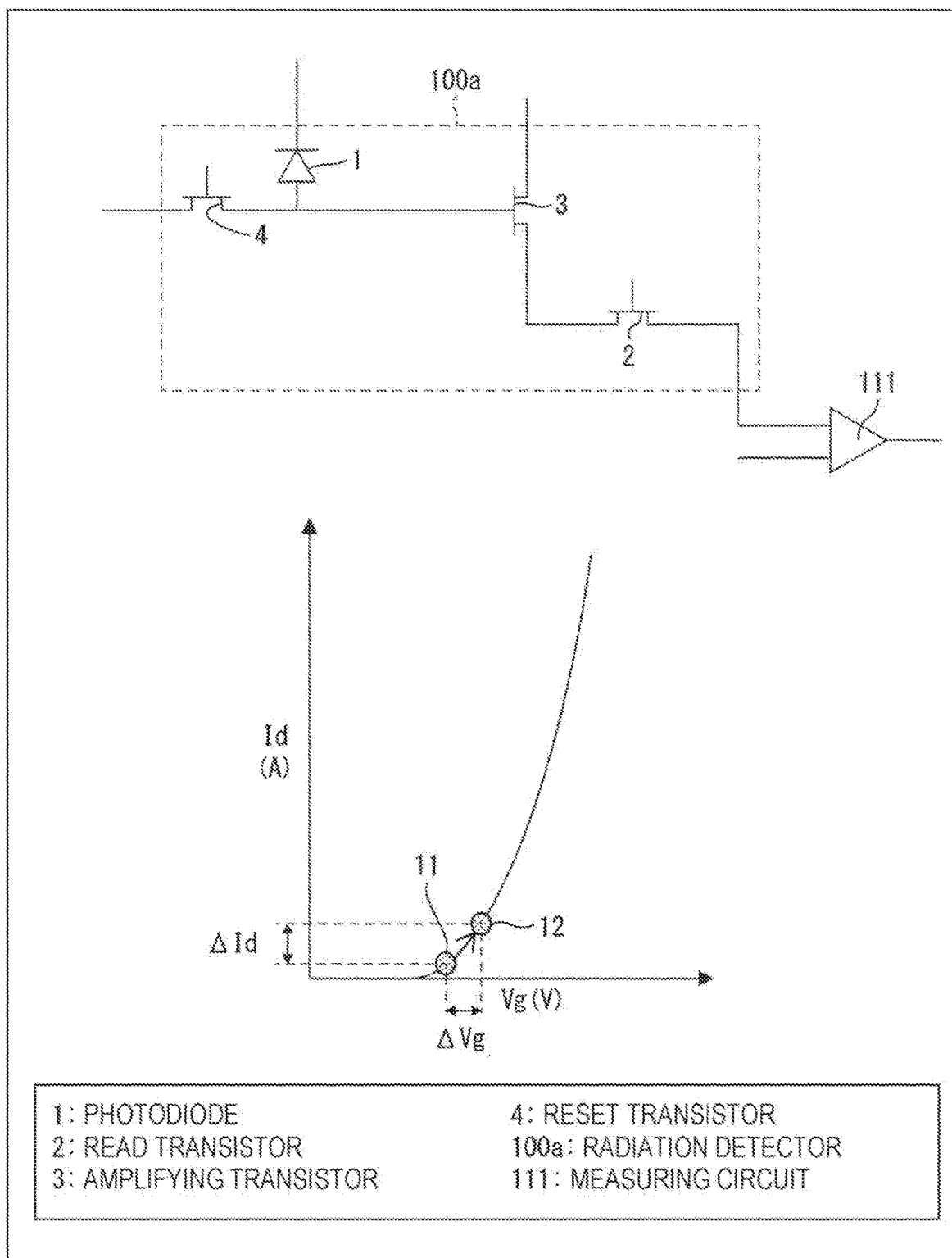
FIG. 10 is a circuit diagram illustrating the configuration of the radiation detector according to the comparative example and illustrates a second step of the operation mechanism.
Figure 11:
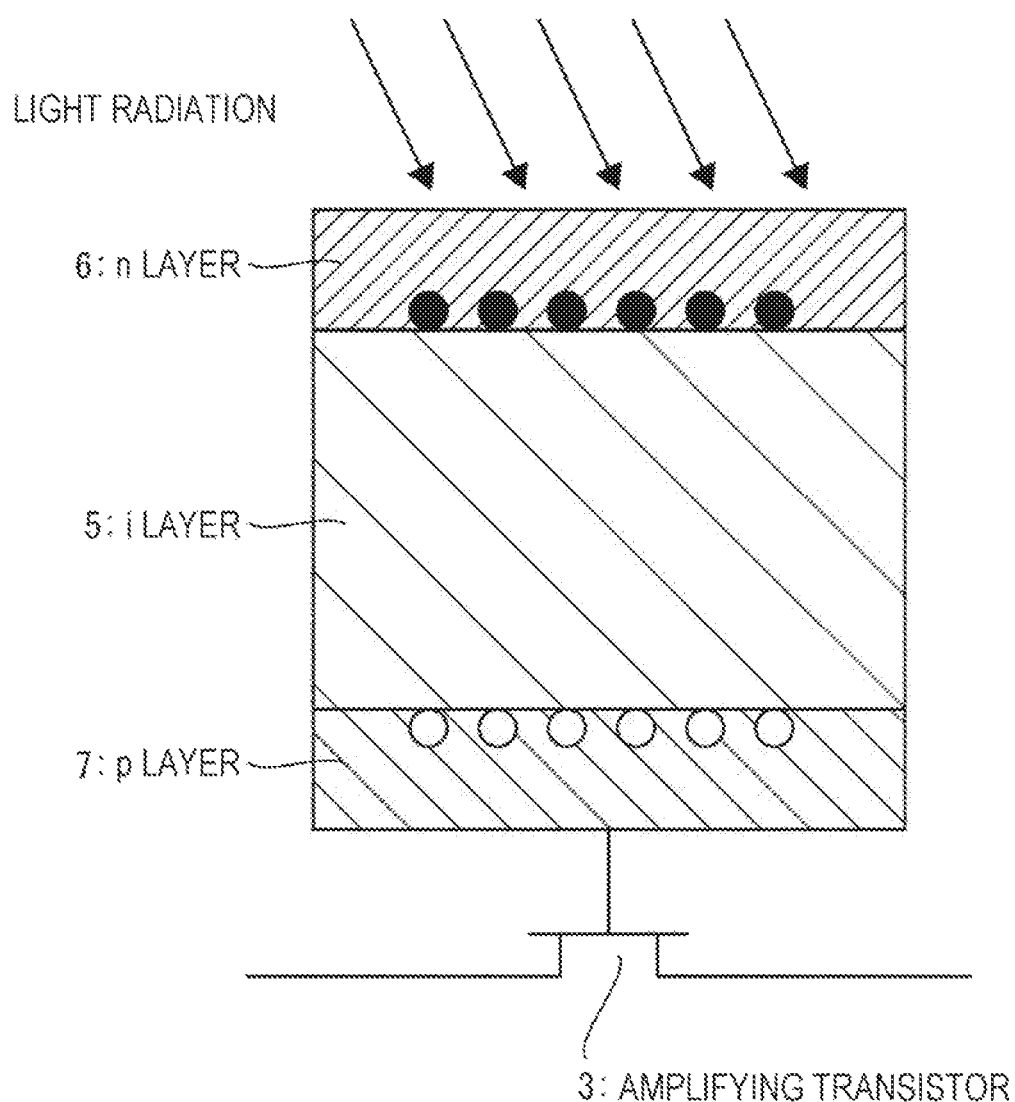
FIG. 11 is an image diagram illustrating a connection relationship between a photodiode and a gate of an amplifying transistor in a radiation detector illustrated in FIG. 9.

FIGS. 9 and 10 are circuit diagrams illustrating the configuration of a radiation detector 100a according to a comparative example and illustrate first and second steps, respectively, of an operation mechanism. Graphs of curves indicating characteristics corresponding to the graphs presented in FIG. 1 and the like are also presented. FIG. 11 is an image diagram illustrating a connection relationship between the photodiode 1 and the gate of the amplifying transistor 3 in the radiation detector 100a illustrated in FIG. 9.

Differences between the radiation detector 100a and the radiation detector 100 are as follows. That is, in the radiation detector 100a, an anode of the photodiode 1 is connected to the node between the amplifying transistor 3 and the reset transistor 4. In the radiation detector 100a, the p layer 7 is connected to the gate of the amplifying transistor 3 (see FIG. 11). As a result, in the radiation detector 100a, the voltage Vg increases due to holes generated by reception of light by the photodiode 1, and the current Id according to the increase in the voltage Vg flows.

In the radiation detector 100a, the amplifying transistor 3 is configured such that the photodiode 1 receives the light with the amplifying transistor 3 conductive.

First, in the first step, the reset transistor 4 becomes conductive, and the voltage Vg becomes substantially 0 V (see a point 11). Next, in the second step, the photodiode 1 receives light, and charge is accumulated in the photodiode 1 on the side of the amplifying transistor 3, that is, on a side of the anode of the photodiode 1, thereby increasing the voltage Vg (see a point 12). Here, the amount of increase in the voltage Vg and the amount of increase in the current Id when the voltage Vg is substantially 0 V as described above are a voltage ΔVg and a current ΔId, respectively. When the current Id flows thereafter, the current Id also increases due to the increase in the voltage Vg in the second step.

With the radiation detector 100a, a change in the current Id is small when a change in the voltage Vg caused by reception of light by the photodiode 1 is small. It is therefore more difficult to increase the sensitivity of the radiation detector 100a than that of the radiation detector 100.

Figure 12:
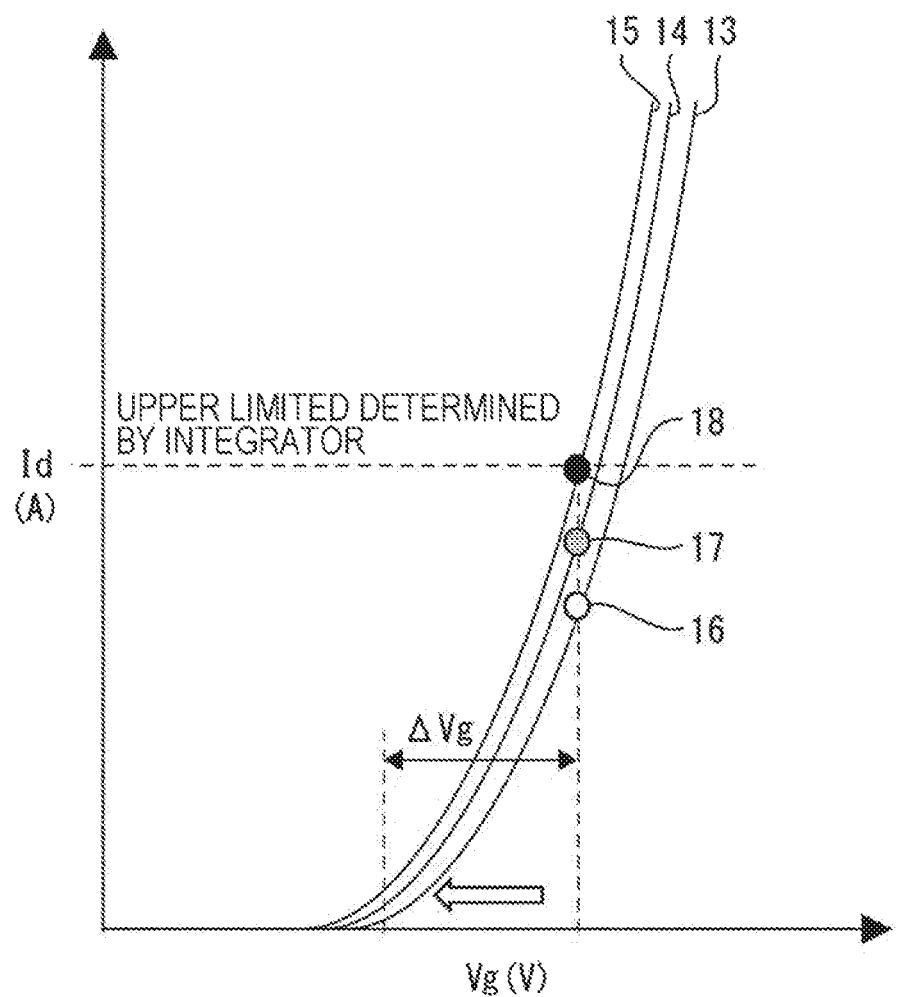
FIG. 12 is a graph illustrating variation in characteristics of amplifying transistors of a plurality of radiation detectors illustrated in FIG. 1.

FIG. 12 is a graph illustrating variation in characteristics of amplifying transistors 3 of a plurality of radiation detectors 100 illustrated in FIG. 1. Definitions of a horizontal axis and a vertical axis in the graph of FIG. 12 are the same as those of the horizontal axis and the vertical axis in the graphs of FIG. 1 and the like.

If the amount of light received by the photodiode 1 is large, the voltage ΔVg becomes large. In other words, a level of an electrical signal caused by the reception of light by the photodiode 1 rises.

In the radiation detector 100, the amount of charge flowing into the measuring circuit 111 is counted. The amount of charge is obtained from the following expression. A period of time for which the current Id flows into the measuring circuit 111 is equal to the duration of a conductive state of the read transistor 2.

Amount of charge=Current Id×Period of time for which current Id flows into measuring circuit 111

Here, a large number of radiation detectors 100 are assumed. The voltage Vreset does not substantially vary between the radiation detectors 100. A characteristic of the current Id relative to the voltage Vg can vary relatively significantly between the radiation detectors 100 (i.e., between the amplifying transistors 3). FIG. 12 illustrates such variation with curves 13 to 15. That is, when the voltage Vreset is applied to each of the large number of amplifying transistor 3, the current Id varies in accordance with the variation in the characteristic (see points 16 to 18).

A case where the measuring circuit 111 is achieved by an integrator will be described hereinafter. In this case, the measuring circuit 111 cannot count charge that exceeds a certain amount. It is therefore necessary to determine the current Id and a period of time for which the current Id flows into the measuring circuit 111 such that the charge supplied to the measuring circuit 111 does not exceed the certain amount. The period of time for which the current Id flows into the measuring circuit 111 can be controlled, but it is not realistic to use different currents Id for different radiation detectors 100. It is therefore necessary to determine the period of time for which the current Id flows into the measuring circuit 111 such that not even one of the large number of measuring circuits 111 corresponding to the large number of radiation detector 100 is saturated.

That is, it is preferable to determine the period of time for which the current Id flows into the measuring circuit 111 in accordance with a characteristic with which the current Id becomes largest relative to a certain voltage Vg, namely the curve 15 in FIG. 12. More specifically, the period of time is preferably a maximum period of time with which saturation of the measuring circuit 111 to which charge is supplied from the amplifying transistor 3 having the characteristic indicated by the curve 15 can be avoided. In addition, the current Id and the voltage Vreset, too, are preferably a maximum current and a maximum voltage with which saturation of the measuring circuit 111 to which charge is supplied from the amplifying transistor 3 having the characteristic indicated by the curve 15 can be avoided. With these conditions, the radiation detector 100 whose sensitivity is optimized can be achieved while certainly avoiding saturation of the measuring circuit 111.

The following holds true for each of the large number of radiation detectors 100. Charge is generated as a result of reception of light by the photodiode 1, and the voltage Vg decreases by the voltage ΔVg. After the reception of light, the measuring circuit 111 measures the amount of charge based an the current Id that has decreased. The voltage Δvg is obtained from a difference in the amount of charge before and after the reception of light, and the amount of light can be obtained from the voltage Δvg. As a result, the amount of radiation can be monitored for each of the pixels described above.

Figure 13:
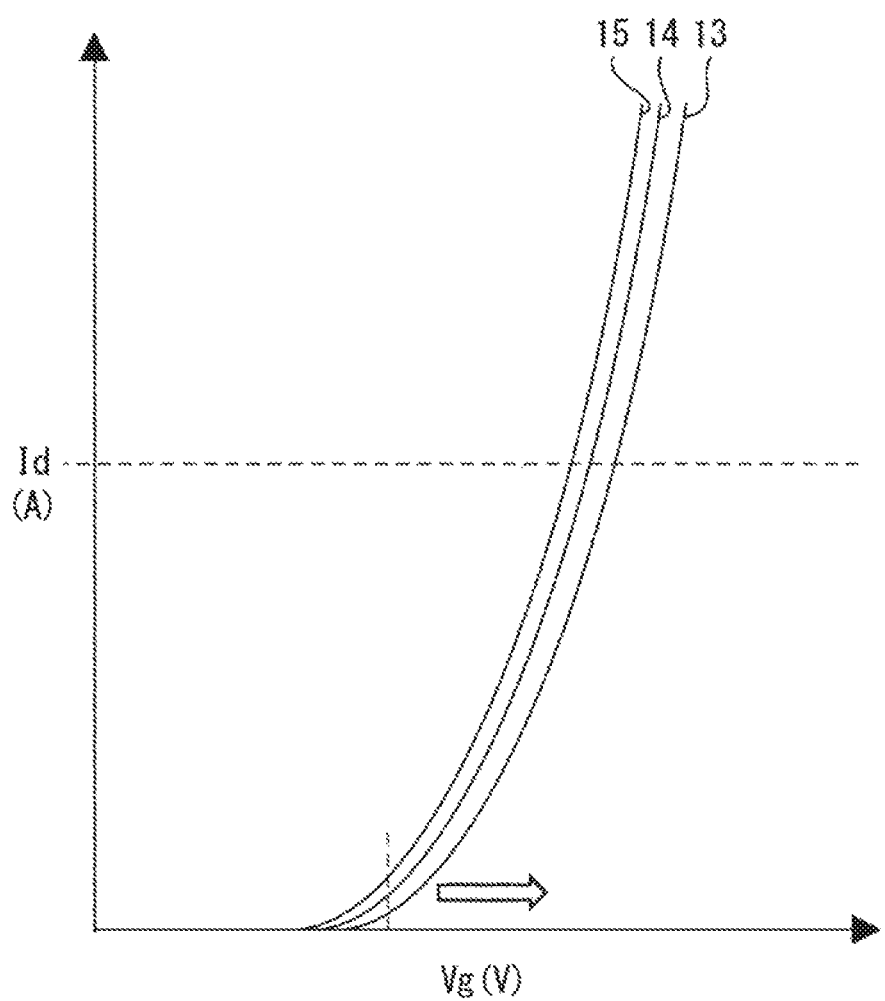
FIG. 13 is a graph illustrating a comparative example of FIG. 12.

In the radiation detector 100a, the current Id ideally infinitely increases as the amount of light received by the photodiode 1 increases. If the amount of light received by the photodiode 1 is extremely large, therefore, it is difficult to certainly avoid saturation of the measuring circuit 111 no matter how carefully the period of time for which the current Id flows into the measuring circuit 111 and a specific value of the voltage Vreset are set (refer to FIG. 13). Definitions of a horizontal axis and a vertical axis in the graph of FIG. 13 are the same as those of the horizontal axis and the vertical axis in the graphs of FIG. 1 and the like.

FIG. 14 is a diagram illustrating a cross-sectional structure of the radiation detector 100 according to the first embodiment of the present invention. The radiation detector 100 includes a glass substrate 51, a gate electrode 52, a channel layer 53, a drain electrode 54, a source electrode 55, insulating films 56 to 60, a photodiode lower electrode layer 61, a photodiode main layer 62, a photodiode upper electrode layer 63, an upper wiring electrode 64, and a base 65 of the photodiode lower electrode layer. The photodiode lower electrode layer 61, the photodiode main layer 62, the photodiode upper electrode layer 63, the upper wiring electrode 64, and the base 65 of the photodiode lower electrode layer correspond to the photodiode 1. The gate electrode 52, the channel layer 53, the drain electrode 54, and the source electrode 55 correspond to the amplifying transistor 3.

The gate electrode 52 is connected to the base 65 of the photodiode lower electrode layer, and the base 65 of the photodiode lower electrode layer is connected to the photodiode lower electrode layer 61. The photodiode 1 is provided above the amplifying transistor 3, and accordingly the photodiode lower electrode layer 61 is provided above the amplifying transistor 3. As a result, the photodiode lower electrode layer 61 can function as a back gate of the amplifying transistor 3. Consequently, the threshold voltage of the amplifying transistor 3 becomes stable, and variation in the amount of radiation detected can be suppressed.

Second Embodiment

The second gate electrode 53 preferably includes an oxide semiconductor having a non-amorphous crystal structure. Because fluctuation in the threshold voltage of the amplifying transistor 3 can be further reduced in this case, variation in the amount of radiation detected can be further suppressed. It is possible, for example, to employ a crystal structure, not an amorphous structure, strongly oriented along a c-axis (a direction perpendicular to a film surface) in a channel film growth direction.

Constituent elements of the channel layer 53 preferably include at least In (indium) and Zn (zinc). In this case, a small amplifying transistor 3 can be formed. As a result, even if photodiodes 1 are fabricated densely, a light receiving area can be secured, and an apparatus capable of obtaining high-resolution images with a small amount of radiation can be developed. It is possible, for example, to achieve the amplifying transistor 3 with a transistor for which an In—Ga (gallium)-Zn oxide semiconductor is used.

Conclusion

A radiation detector according to a first aspect of the present invention includes a light receiving device that receives light obtained from radiation and that converts the light into an electrical signal and an amplifying transistor that amplifies the electrical signal. The amplifying transistor is configured such that the light receiving device receives the light with the amplifying transistor conductive.

With the above configuration, it is easy to greatly a current flowing to the amplifying transistor even when a change in the gate voltage of the amplifying transistor caused by reception of light by the light receiving transistor is small. With the above configuration, therefore, a high-sensitivity radiation detector can be achieved.

A radiation detector according to a second aspect of the present invention is preferably the radiation detector according to the first aspect in which the light receiving device is a photodiode.

A radiation detector according to a third aspect of the present invention is the radiation detector according to the first or second aspect in which the amplifying transistor includes a channel layer. The channel layer includes an oxide semiconductor having a non-amorphous crystal structure.

With the above configuration, fluctuation in the threshold voltage of the amplifying transistor can be further reduced, and variation in the amount of radiation detected can be further suppressed.

A radiation detector according to a fourth aspect of the present invention is the radiation detector according to any of the first to third aspects in which the amplifying transistor includes a channel layer. Constituent elements of the channel layer include at least indium and zinc.

With the above configuration, a small amplifying transistor can be formed. As a result, even if light receiving devices are fabricated densely, a light receiving area can be secured, and an apparatus capable of obtaining high-resolution images with a small amount of radiation can be developed.

A radiation detector according to a fifth aspect of the present invention is the radiation detector according to any of the first to fourth aspects in which the light receiving device is provided above the amplifying transistor.

With the above configuration, as electrode of the light receiving device having the same potential as a gate of the amplifying transistor can function as a back gate of the amplifying transistor. As a result, the threshold voltage of the amplifying transistor becomes stable, and variation in the amount of radiation detected can be suppressed.

The present invention is not limited to the above-described embodiments, and may be modified in various ways within the scope defined by the claims. The technical scope of the present invention also includes embodiments obtained by appropriately combining together technical means disclosed in different embodiments. Furthermore, by combining together technical means disclosed in different embodiments, new technical features can be achieved.

REFERENCE SIGNS LIST 1 photodiode (light receiving device)
2 read transistor
3 amplifying transistor
4 reset transistor
5 i layer
6 n layer
7 p layer
51 glass substrate
52 gate electrode
53 channel layer
54 drain electrode
55 source electrode
56 to 60 insulating film
61 photodiode lower electrode layer
62 photodiode main layer
63 photodiode upper electrode layer 64 upper wiring electrode
65 base of photodiode lower electrode layer
100 radiation detector
111 measuring circuit

The invention claimed is:

1. A radiation detector comprising:
a light receiving device that receives light obtained from radiation and that converts the light into an electrical signal; and
an amplifying transistor that amplifies the electrical signal,
wherein the amplifying transistor is configured such that the light receiving device receives the light with the amplifying transistor conductive,
the radiation detector further comprising:
a reset transistor for applying a reset voltage Vg on a gate electrode of the amplifying transistor so as to put the amplifying transistor in a conductive state in advance; and
a measuring circuit for measuring a current supplied by the amplifying transistor according to a voltage applied on the gate electrode,
wherein
the amplifying transistor has, at an electrode of the light receiving device, a back gate for suppressing variation in amount of radiation detected,
the Vg is a maximum voltage with which saturation of the measuring circuit to which a current is supplied by the amplifying transistor is able to be avoided, and
reception of light by the photodiode decreases the voltage Vg, and a current according to the decreased voltage Vg is measured, so that the amount of radiation is measured.

2. The radiation detector according to claim 1, wherein the light receiving device is a photodiode.

3. The radiation detector according to claim 1, wherein the amplifying transistor includes a channel layer, and
wherein the channel layer includes an oxide semiconductor having a non-amorphous crystal structure.

4. The radiation detector according to claim 1, wherein the amplifying transistor includes a channel layer, and
wherein constituent elements of the channel layer include at least indium and zinc.

5. The radiation detector according to claim 1, wherein the light receiving device is provided above the amplifying transistor.

6. The radiation detector according to claim 3, wherein the oxide semiconductor having the non-amorphous crystal structure is oriented along a c-axis.

7. The radiation detector according to claim 5, wherein an electrode of the light receiving device is connected to a gate electrode of the amplifying transistor.

8. The radiation detector according to claim 5, wherein the amplifying transistor includes a channel layer, and
wherein the channel layer includes an oxide semiconductor having a non-amorphous crystal structure and being oriented along a c-axis.

* * * * *